United States Patent [19]
Lang et al.

[11] Patent Number: 5,250,342
[45] Date of Patent: * Oct. 5, 1993

[54] COMPOSITE EMI SHIELD HAVING CLEAN, HIGHLY CONDUCTIVE SURFACES FOR CONDUCTIVE BONDING

[75] Inventors: Charles F. Lang, Monroe; Rocco R. DiGenova, Wallingford, both of Conn.

[73] Assignee: United Technologies Corporation, Hartford, Conn.

[*] Notice: The portion of the term of this patent subsequent to May 24, 2005 has been disclaimed.

[21] Appl. No.: 869,873

[22] Filed: Apr. 16, 1992

Related U.S. Application Data

[63] Continuation of Ser. No. 356,456, May 24, 1989, abandoned.

[51] Int. Cl.$^5$ .............. B32B 3/18; B32B 31/18; H05K 9/00
[52] U.S. Cl. .................. 428/138; 428/166; 428/458; 428/134; 428/139; 428/140; 428/246; 428/247; 428/256; 428/408; 428/290; 428/251; 428/252; 428/268; 428/433; 428/475.2; 428/344; 428/41; 428/42; 361/218; 174/35 R; 174/35 MS
[58] Field of Search ........ 361/218; 174/35 R, 35 MS; 428/138, 166, 458, 134, 139, 140, 246, 247, 256, 408, 290, 251, 252, 268, 433, 475.2, 344, 41, 42

[56] References Cited

U.S. PATENT DOCUMENTS

| | | | |
|---|---|---|---|
| 3,247,574 | 4/1966 | Wirtz | 174/35 MS |
| 3,350,497 | 10/1967 | Weaver et al. | 174/35 MS |
| 3,755,713 | 5/1973 | Paszkowski | 361/218 |
| 4,608,453 | 8/1986 | Freeman | 174/35 MS |
| 4,649,461 | 3/1987 | Matsuta | 174/35 R |
| 4,746,389 | 5/1988 | DiGenova | 156/247 |

Primary Examiner—Ellis P. Robinson
Assistant Examiner—William P. Watkins, III
Attorney, Agent, or Firm—McAulay Fisher Nissen Goldberg & Kiel

[57] ABSTRACT

An EMI shield is disclosed for providing EMI protection. The shield is lightweight, and easily moldable into complex shapes, having conductive mating surfaces provided on opposite sides thereof. The clean, highly conductive mating surfaces are part of an embedded aluminum wire mesh sandwiched between at least two face plies which add strength to the shield. By sandwiching the metal mesh alternately with a nonporous tape, and a barrier tape ply, clean conductive areas can be provided on either side of the shield, easing attachment to adjacent structures. During curing, the tapes prevent direct resin inclusion into the metal mesh. After curing, the nonporous tape is removed to expose the clean, highly conductive mating surfaces.

18 Claims, 2 Drawing Sheets

COMPOSITE EMI SHIELD HAVING CLEAN, HIGHLY CONDUCTIVE SURFACES FOR CONDUCTIVE BONDING

This invention was made with Government support under a contract awarded by the Department of the Navy. The Government has certain rights in this invention.

This is a continuation, of application Ser. No. 07/356,456, filed May 24, 1989, abandoned.

CROSS REFERENCE TO RELATED APPLICATION

This application is related to U.S. Pat. No. 4,746,389 which issued to R. DiGenova on May 24, 1988.

DESCRIPTION

1. Technical Field

This invention relates to composite EMI shields having clean, highly conductive electrical bonding surfaces on opposite sides for providing continuous electromagnetic shielding with adjacent conductive surfaces.

2. Background

Electromagnetic environmental effects, described alternately as electromagnetic interference (EMI), electromagnetic pulse (EMP), electromagnetic vulnerability (EMV), etc., refers to the susceptibility of electronic devices to external electromagnetic fields. These effects, hereinafter referred to collectively as EMI, affect electronic devices by causing current fluctuations which result in unexpected switching within microprocessor units and semiconductor chips. Since advanced chips utilize increased speed at lower current draws than older chips, electronic devices incorporating these chips are more susceptible to damage from EMI, particularly in applications with a high density of electronics, such as aircraft.

A related problem is lightning strikes. While aircraft lightning strikes are not uncommon, most aircraft utilize an aluminum skin which shields critical internal electronic devices from damage. With the trend towards utilizing composite aircraft structures, there is concern that lightning strikes may jeopardize aircraft safety. Since composites are not good conductors, they cannot shield interior circuits, and a lightning strike may move directly along internal conductors and detrimentally effect the flight avionics. The developments of digital engine controls, fly by wire flight controls and artificial stabilization have made these avionics packages more central to aircraft safety and less able to survive even brief interruptions of function.

A common method of mitigating the potential damage from EMI is the inclusion of a continuous conductive shield around sensitive electronic systems. Several methods exist for providing this shielding on an aircraft using composite components. One method involves the ion vapor deposition of a conductive metal, such as aluminum, onto the composite surface. However, ion vapor deposition requires processing in a vacuum chamber, hence, part size is limited and the processing itself is relatively expensive. In addition, effective ion vapor deposition is highly dependent on proper surface preparation and the metallized surfaces are susceptible to impact damage and wear.

Another method utilizes electroless plating onto the part surface. Electroless plating processes involve immersion in a series of solutions and consequently part size is limited to tank size. This currently excludes the larger aircraft structures, and again, these surfaces are susceptible to impact damage and wear.

Another method requires embedding conductive metal mesh, such as aluminum wire mesh, in the composite article during fabrication. This provides a conductive layer while utilizing standard composite parts fabrication processes. Presently EMI and lightning strike protection for aircraft composite structures is provided by embedding a woven aluminum mesh on or under the surface of the structure. The structure may be fabricated by including a first layer of aluminum wire mesh in a mold with a plurality of composite prepreg laminates built-up thereover. During molding, resin flows into the voids of the mesh under an even pressure, integrating the structure. While providing excellent conductive properties within a single composite article, problems arise in achieving complete conductance bonding between two adjacent composite articles due to the resin impregnation of the metal mesh. Presently, excess resin is sanded away along the mating surface to expose the metal mesh and provide an electrical bonding surface. However, sanding does not provide a completely resin free surface, resulting in higher resistances and reduced shielding effectiveness. The sanding operating is also sensitive to mechanical proficiency and may cause damage to the aluminum wire mesh. Consequently, shielding effectiveness may vary from part to part, which is unacceptable in many critical applications.

A need also exists for composite articles which are used as shields around various devices without being an integral part thereof. These shields must have conductive areas on opposite sides for integral conductive bonding. For example, in an aircraft having a metal skin, it may be desired to additionally isolate an area or group of instruments to increase the assurance of protection. Such a shield must be relatively thin, lightweight and be moldable in complex shapes yet provide clean surface areas for conductive bonding to adjacent shields or structures. Such shielding must also be able to accommodate access panels or doors without adding excessive complexity during fabrication.

DISCLOSURE OF INVENTION

According to the present invention, a composite article is disclosed for providing an EMI shield with highly conductive surfaces for mating with adjacent articles. The composite shield comprises at least one conductive layer for lightning or electromagnetic interference shielding, face plies on opposite sides of the conductive layer, each face ply having cutout areas to accommodate mating surfaces, barrier tape, placed behind the conductive layer, between the conductive layer and the corresponding face ply, complimentary to the cutout areas, and, removable nonporous tape placed in the cutout areas adjacent the face plies.

Utilizing the barrier tape and the nonporous tape prevents excessive resin inclusion in the metal mesh, with the two conductive areas provided on opposite sides of the shield. After fabrication, the nonporous tape is removed to expose the clean metal mesh along the mating surfaces for engaging adjacent articles, which may also be composite structures with corresponding clean metal mesh surfaces, or be metal structures. In addition, reinforcing plies may be provided in the conductive mating areas to increase stiffness.

The shield provided is lightweight, and easily moldable into complex shapes, having conductive mating surfaces provided on opposite sides thereof. By sandwiching the metal mesh alternately with a nonporous tape, and a barrier tape ply, clean conductive areas can be provided on either side of the shield, easing attachment to adjacent structures, and allowing tailoring of the shield to fit within defined structures, without sacrificing continuous conductivity, providing a simple and efficient means of providing a complex shaped shield, ensuring adequate EMI and lightning strike protection.

BEST MODE FOR CARRYING OUT THE INVENTION

Figure 1:
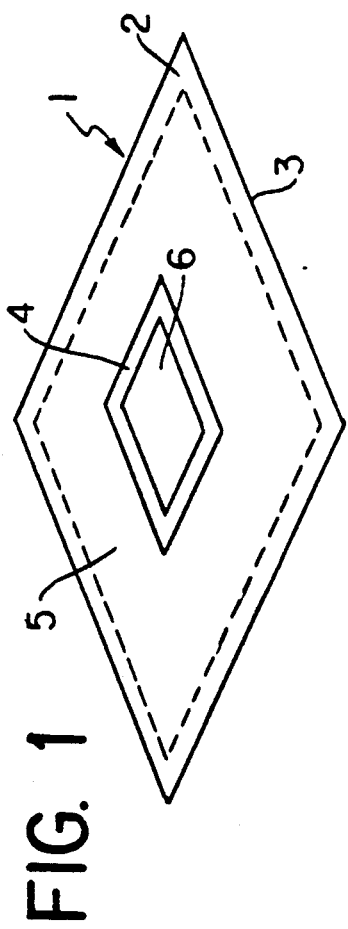
FIG. 1 is a view of a composite EMI shield of the present invention.

Referring to FIG. 1, a composite EMI shield is shown after molding. For illustrative purposes, the shield 1 is essentially flat and square, requiring a clean, highly conductive edge surface 2 (in phantom) on one side 3, and a clean, highly conductive edge surface 4 on the other side 5 around a cutout area 6. Such highly conductive edge surfaces may be obtained as taught by U.S. Pat. No. 4,746,389 to DiGenova, commonly assigned herewith and hereby incorporated by reference, which discloses a method for providing a clean, highly conductive mating surface in a composite article.

Figure 2:
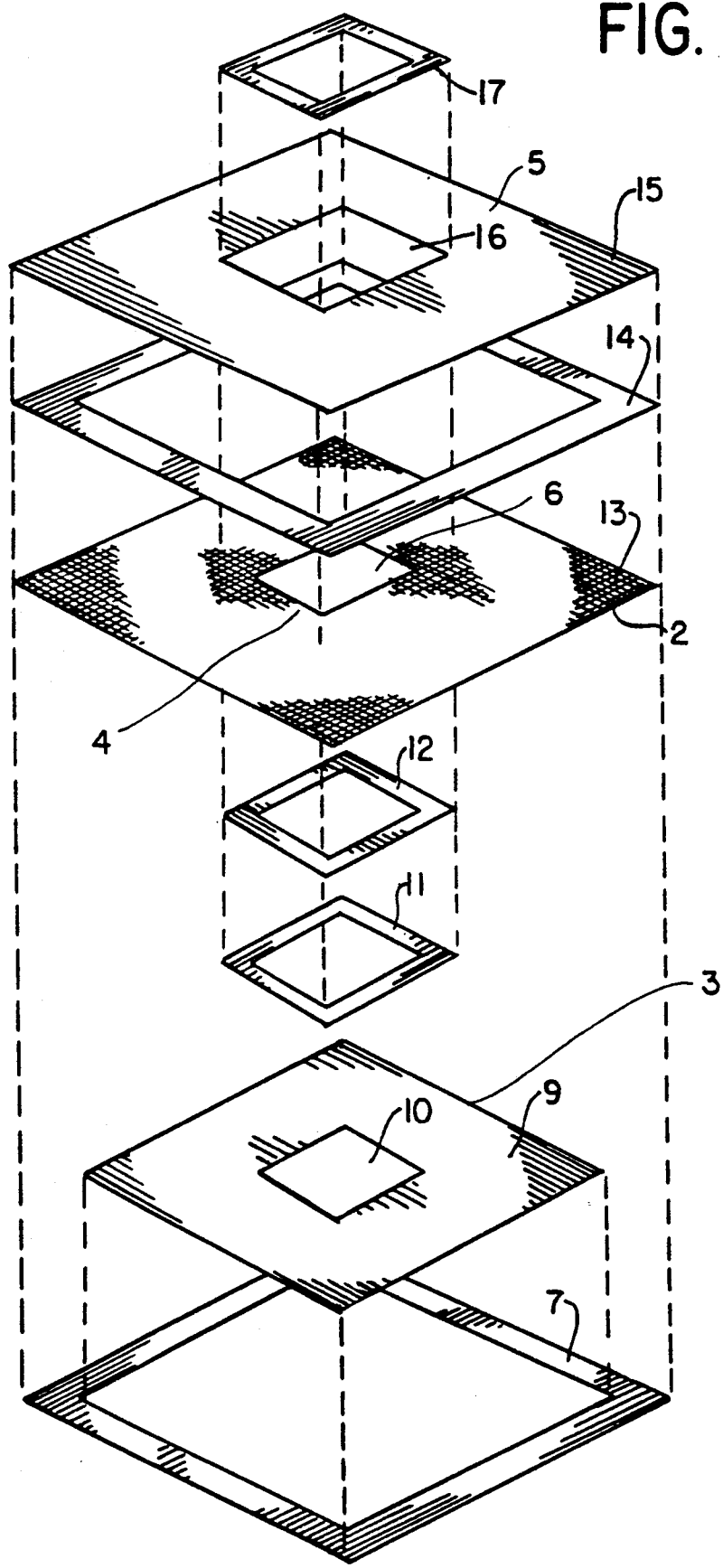
FIG. 2 is an exploded view of the shield of FIG. 1.

Referring to FIG. 2, an exploded view of the shield of FIG. 1 is shown. A nonporous tape 7 is laid onto a tool or mold surface 8 (not shown) in the edge area 2 required for conductive bonding. For purposes of this disclosure, "bonding" means connecting various structures so that these structures form a continuous electrical unit, preventing buildup of electricity on one structure by discharging to the other structures. For illustrative purposes, the tape 7 is CHO-MASK, tape made by the Chomerics Company, which includes a conductive adhesive backing on a copper foil with a Mylar facing, MYLAR being a brand of strong thin polyester film. A nonporous tape is required to prevent resin infiltration. While CHO-MASK, tape is discussed, any nonporous material which would survive fabrication and be removable from the completed article could be used.

The tape 7 forms the periphery of the shield, and a single composite face ply 9 is then laid within the area defined by the tape. This ply 9 forms the side 3 of the shield 1. The ply has a cutout area 10 corresponding to the shield cutout area 6, for example for use as an access hole through the shield. A reinforcing ply 11, of a size to support the desired conductive edge 4 of the cutout area is then added. A barrier tape 12 is then laid over this reinforcing ply. A metal mesh ply 13 is then laid over the tape 7, face ply 9, and barrier 12, with the metal mesh possibly being of an expanded aluminum foil or wire variety. Where the metal mesh overlays the tape 7, it corresponds to conductive edge surface 2. For example, an aluminum wire mesh formed from 0.0021 inch diameter wire, composed of 5056-0 aluminum and weaved at a wire density of 200 wires per inch may be used. Another metal mesh ply may be laid over the first mesh ply 13. The number of metal mesh plies employed will depend upon the degree of shielding required for the particular application. While two metal mesh plies are preferred, any number of metal mesh plies may be used. The metal mesh ply is sized to cover the tape and the barrier ply, and may include cutout areas for openings. Of course, these could be trimmed after fabrication.

After the metal mesh is installed, a barrier tape 14 is included above the nonporous tape 7 on the periphery, sandwiching a portion of the metal mesh between the tapes. A composite face ply 15 is placed, the tape 17 corresponding to the conductive edge surface 4 over the periphery of the tape 7, the ply 15 having a cutout area 16, into which a nonporous tape 17 is placed.

The barrier tapes prevent direct resin inclusion into the metal mesh. For illustrative purposes, the barrier tape comprises a low flow film adhesive (AF126-2) purchased from the 3M Company, which serves as an effective resin barrier while providing a good internal bond within the laminate. While a film adhesive is disclosed, any barrier material which would prevent direct resin inclusion and be compatible with the resin/fiber combination and molding process may be used. For example, a Mylar ® tape, with or without an adhesive peel ply backing could be used.

The face or reinforcing plies may comprise resin preimpregnated fiberglass, Kevlar ® (polyaramid), graphite or other hybrid laminates. After stacking, the assembly is vacuum bagged, placed in the appropriate autoclaving device, heated under pressure and cured.

Figure 3:
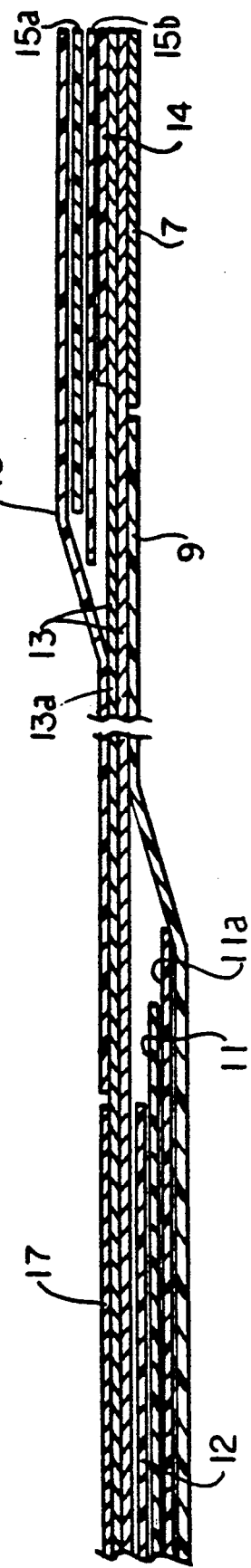
FIG. 3 is a partial cross sectional view of an alternative embodiment of a composite EMI shield.

During the cure cycle, resin from the composite plies flows between the plies to ensure consolidation into a single shield. As described in U.S. Pat. No. 4,746,389 to DiGenova, previously incorporated by reference, the barrier tape prevents the resin flow from directly infiltrating the metal mesh along the mating surfaces. However, the barrier tape does allow indirect resin flow along the ply edges to prevent ply shifting. After curing, the article is removed from the mold and the edges trimmed by cutting through the barrier tape, metal mesh and nonporous tape. Similarly, the cutout edges may be trimmed. The CHO-MASK tape is then peeled off, top and bottom, revealing two clean mesh edges suitable for conductive joining to adjacent structures. In the case of exposed aluminum mesh, alodining may be performed to provide corrosion protection to the mating surface while still permitting electrical conductivity. The article may then be mated to the adjoining article using metal straps, bolts or conductive gaskets to assure a continuously conductive joint. FIG. 3 illustrates an alternative shield in partial cross section, including two metal mesh plies, 13 and 13a, and additional reinforcing plies 11a and 15a and 15b, around the conductive edge surfaces.

It will be understood by those skilled in the art that the present invention is not limited to the embodiments shown and that any prepreg layup or filament wound composite structure utilizing metal mesh for EMI/lightning protection and requiring electrical bonding to an adjoining article could utilize this invention. In addition, the present invention is contemplated to have application in many areas due to the wide usage of electronic devices subject to EMI, including but not limited to automotive and household uses which require electrical bonding of composite structures.

While this invention has been shown and described in relation to a method of EMI/lightning shielding of aircraft, it will be understood by those skilled in the art that any other applications requiring electromagnetic shielding may utilize the present invention. In addition, while a conductive mating surface has been discussed, it will be understood that any shape conductive mating surface may be provided by simply tailoring the barrier and nonporous tapes. For example, square, round or oblong shapes may be produced. In addition, the shape of the shield may be molded to accommodate recessed fixtures, access plates, or other structures, simply by adjusting the type of mold surface. Thus, complex shapes may be constructed suitable for housing individual devices of particular sensitivity to EMI.

I claim:

1. A composite EMI shield comprising:
   at least one conductive layer for lightning or electromagnetic interference shielding;
   face plies on opposite sides of the conductive layer, each face ply having cutout areas to accommodate mating surfaces;
   barrier tape, placed behind the conductive layer, between the conductive layer and the corresponding face ply, complimentary to the cutout areas; and,
   removable nonporous tape placed in the cutout areas adjacent the face plies.

2. The shield of claim 1 wherein said conductive layer comprises a conductive metal mesh or metal foil ply.

3. The shield of claim 1 wherein said conductive layer comprises aluminum metal mesh.

4. The shield of claim 1 wherein said face plies comprise fiberglass, graphite or polyaramid fiber reinforced, resin impregnated composite plies.

5. The shield of claim 1 wherein said nonporous tape comprises a copper foil with a polyester film facing and adhesive backing.

6. The shield of claim 1 wherein the barrier tape comprises a low flow film adhesive.

7. The shield of claim 1 wherein the barrier tape comprises a polyester film tape.

8. The shield of claim 1 further comprising one or more reinforcing plies placed between the barrier tape and the face ply to strengthen the mating surfaces.

9. The shield of claim 8 wherein said reinforcing plies comprise fiberglass, graphite or polyaramid fiber reinforced, resin impregnated composite plies.

10. A composite EMI shield comprising:
    two conductive sheets placed together to form a conductive layer for lightning or electromagnetic interference shielding;
    face plies on opposite sides of the conductive layer, each face ply having cutout areas to accommodate mating surfaces;
    removable nonporous tape placed in the cutout areas adjacent the face plies;
    barrier tape, placed behind the conductive layer, between the conductive layer and the corresponding face ply, complimentary to the cutout areas; and,
    one or more reinforcing plies placed between the barrier tape and the face ply to strengthen the mating surfaces.

11. The shield of claim 10 wherein said conductive layer comprises a pair of conductive metal mesh or metal foil plies.

12. The shield of claim 10 wherein said conductive layer comprises aluminum metal mesh plies.

13. The shield of claim 10 wherein said face plies and reinforcing plies comprise fiberglass, graphite or polyaramid fiber reinforced, resin impregnated composite plies.

14. The shield of claim 10 wherein said nonporous tape comprises a copper foil with a polyester film facing and adhesive backing.

15. The shield of claim 10 wherein the barrier tape comprises a low flow film adhesive.

16. The shield of claim 10 wherein the barrier tape comprises a polyester film tape.

17. The shield of claim 1 wherein the barrier tape comprises a polyester film tape with an adhesive peel ply backing.

18. The shield of claim 10 wherein the barrier tape comprises a polyester film tape with an adhesive peel ply backing.

* * * * *